US008317107B2

(12) United States Patent
Buot et al.

(10) Patent No.: US 8,317,107 B2
(45) Date of Patent: Nov. 27, 2012

(54) CHIP-SPACER INTEGRATED RADIO FREQUENCY ID TAGS, METHODS OF MAKING SAME, AND SYSTEMS CONTAINING SAME

(75) Inventors: Joan Rey V. Buot, Cebu (PH); Christian Orias, Metro Manila (PH)

(73) Assignee: Intel Corporation, Santa Clara, CA (US)

( * ) Notice: Subject to any disclaimer, the term of this patent is extended or adjusted under 35 U.S.C. 154(b) by 878 days.

(21) Appl. No.: 11/323,903

(22) Filed: Dec. 30, 2005

(65) Prior Publication Data

US 2007/0152069 A1 Jul. 5, 2007

(51) Int. Cl.
*G06K 19/06* (2006.01)
(52) U.S. Cl. .................................. 235/491; 235/492
(58) Field of Classification Search .............. 235/491, 235/492; 257/777
See application file for complete search history.

(56) References Cited

U.S. PATENT DOCUMENTS

| | | | | |
|---|---|---|---|---|
| 5,563,086 | A * | 10/1996 | Bertin et al. | 438/15 |
| 6,215,193 | B1 | 4/2001 | Tao et al. | |
| 2002/0090753 | A1 | 7/2002 | Pai et al. | |
| 2003/0170989 | A1 * | 9/2003 | Bothra | 438/689 |
| 2004/0012079 | A1 | 1/2004 | Khiang | |
| 2004/0188531 | A1 * | 9/2004 | Gengel et al. | 235/491 |
| 2005/0073045 | A1 * | 4/2005 | Kaewell, Jr. | 257/724 |
| 2005/0093172 | A1 | 5/2005 | Tsukahara et al. | |
| 2005/0135041 | A1 * | 6/2005 | Kang et al. | 361/301.4 |
| 2005/0168961 | A1 | 8/2005 | Ono et al. | |

FOREIGN PATENT DOCUMENTS

| | | |
|---|---|---|
| JP | 11-316809 A | 11/1999 |
| JP | 2005-111928 A | 4/2005 |
| JP | 2005210676 A | 8/2005 |
| WO | WO-2007102871 A2 | 9/2007 |
| WO | 2007102871 A3 | 1/2008 |

OTHER PUBLICATIONS

Office Action and Search Report for Taiwan Patent Application No. 95147203, mailed on Jan. 21, 2010, 7 pages of Taiwan Office Action and 11 pages of English Translation.
Office Action for German Patent Application No. 11 2006 002 962.2, mailed on Feb. 25, 2010, 4 pages of German Office Action and 2 pages of English Translation.
International Search Report and Written Opinion for PCT Application No. PCT/US2006/048055, Mailed on Oct. 18, 2007, 12 pages.
Office Action for China Patent Application No. 200680041310.1, mailed on Aug. 21, 2009, 8 pages of Taiwan Office Action and 8 pages of English Translation.
Office Action for Japanese Patent Application No. 2008-548589, mailed on May 10, 2011, 2 pages of Japanese Office Action including 2 pages of English Translation.
Office Action for Chinese Patent Application No. 200680041310.1, mailed on Mar. 16, 2011, 18 pages of Chinese Office Action including 10 pages of English Translation.

(Continued)

*Primary Examiner* — Kristy A Haupt
(74) *Attorney, Agent, or Firm* — Winkle, PLLC

(57) ABSTRACT

A chip package includes a radio-frequency identification (RFID) tag disposed as a spacer structure on a surface of a die in a chip package. A method includes assembling an RFID spacer structure, to at least one chip such as memory or logic. A computing system includes an RFID spacer structure in a chip package.

15 Claims, 6 Drawing Sheets

OTHER PUBLICATIONS

Office Action for Taiwanese Patent Application No. 95147203, mailed on Feb. 15, 2011, 13 pages of Taiwanese Office Action including 6 pages of English Translation.

Office Action for German Patent Application No. 112006002962.2, mailed on Feb. 9, 2011, 7 pages of German Office Action including 3 pages of English Translation.

International Preliminary Report on Patentability for PCT Patent Application No. PCT/US06/048055, Issued on Jul. 1, 2008, 6 pages.

Office Action for Japanese Patent Application No. 2008-548589, Mailed on Dec. 13, 2011, 4 pages of office Action including 2 pages of English translation.

* cited by examiner

US 8,317,107 B2

CHIP-SPACER INTEGRATED RADIO FREQUENCY ID TAGS, METHODS OF MAKING SAME, AND SYSTEMS CONTAINING SAME

TECHNICAL FIELD

Embodiments relate generally to a chip-level integration of devices.

TECHNICAL BACKGROUND

Product identification during processing such as die sort and die assembly, and also after shipping is an increasing challenge due to the decreasing size of microelectronic devices. Stacked chip-scale packaging (SCSP) lacks adequate product identification for original equipment manufacturers (OEMs) and for other end users.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to an apparatus that includes a radio frequency identification tag (RFID) in a spacer structure that is deployed at chip-level dimensions near an IC die. Embodiments relate to stacked chip-scale packages (SCSP) that include an RFID tag spacer structure such as a silicon-containing spaced between two stacked chips. Embodiments relate to both on-die and in-substrate deployments of RFID tag in a spacer structure. Embodiments also relate to methods of assembling such RFID tags with an IC die. Embodiments also relate to computing systems that incorporate a die-level RFID tags. Embodiments also relate to computing systems with in-substrate deployments of RFID tags.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

Figure 1:
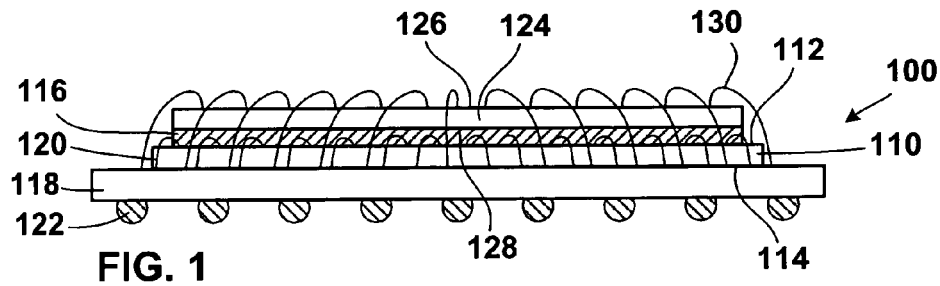
FIG. 1 is a cross-section elevation of a radio-frequency identification device (RFID) tag in a spacer structure between two microelectronic dice according to an embodiment.

FIG. 1 is a cross-section elevation of a radio-frequency identification device (RFID) tag in a spacer structure between two microelectronic dice according to an embodiment. A package 100 includes a first die 110 with an active surface 112 and a backside surface 114. An RFID tag spacer 116 is disposed on the first die 110 active surface 112. In an embodiment, the first die 110 is wire-bonded to a mounting substrate 118. The wire bonding is accomplished with at least one bond wire, one of which is designated with the reference numeral 120. In an embodiment, the mounting substrate 118 communicates electrically to the external world with a plurality of electrical bumps, one of which is designated with the reference numeral 122. In an embodiment, the first die 110 is a logic chip such as a processor made by Intel Corporation of Santa Clara, Calif. In an embodiment, the first die 110 is a memory chip. In an embodiment, the first die 110 is a digital signal processor (DSP) chip.

In an embodiment, a second die 124 is disposed on the RFID tag spacer 116. In this embodiment, the second die 124 includes an active surface 126 and a backside surface 128. The RFID tag spacer 116 is disposed on the second die 124 backside surface 128. In an embodiment, the second die 124 is wire-bonded to the mounting substrate 118. The wire bonding is accomplished with at least one bond wire, one of which is designated with the reference numeral 130.

In an embodiment, the first die 110 is a logic chip such as a processor, and the second die 124 is a memory chip such as flash memory. In an embodiment, the first die 110 is a memory chip, and the second die 124 is a processor. In an embodiment, the first die 110 is logic chip and the second die 124 is a DSP chip. It now becomes apparent that the first die 110 and the second die 124 can be any combination of processor, memory, and DSP chips. One of these combinations includes two processors. One of these combinations includes a processor and a memory chip. One of these combinations includes two memory chips. One of these combinations includes a DSP chip in lieu of either of the memory chip or the processor. One of these combinations includes an embedded DSP chip in either a processor or a memory chip.

Figure 2:
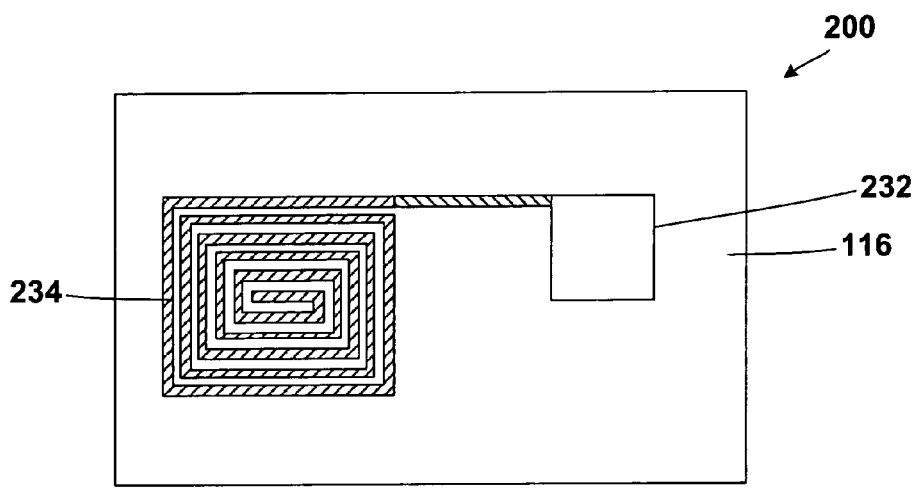
FIG. 2 is a plan of an RFID tag spacer, along with an antenna according to an embodiment.

FIG. 2 is a plan 200 of an RFID tag 232 in a spacer structure 116, along with an antenna 234 according to an embodiment. The RFID tag spacer structure 116 from FIG. 1 is used for illustrative purposes. In an embodiment, the RFID tag 232 is a single IC chip that includes integrated RFID circuitry according to conventional technique. Accordingly, digital memory is contained in the RFID circuitry such that product information such as fab lot, fab location, wafer ID and others are contained in the digital memory. In an embodiment, the RFID tag 232 includes at least one component that is part of an RFID circuitry according to conventional technique. In an embodiment, the RFID tag 232 includes an IC chip and at least one component that is part of an RFID circuitry according to conventional technique. The antenna 234 is depicted as a spiral antenna which, in connection with the RFID tag 232, results in an RFID transceiver according to conventional technique. In an embodiment, the spiral antenna is replaced with an helical antenna.

In an embodiment, the combination of the RFID transceiver 232, 234 is disposed in the spacer structure 116 with the spacer structure 116 being an organic material such as a flex substrate. In an embodiment, the combination of the RFID transceiver 232, 234 is disposed in the spacer structure 116 with the spacer structure 116 being an inorganic material such as an oxide of silicon. In an embodiment, the combination of the RFID transceiver 232, 234 is disposed in the spacer structure 116 with the spacer structure 116 being an inorganic material such as a distribution of polycrystalline silicon. As a unit, the RFID transceiver 232, 234, disposed in the structure 116 is hereinafter referred to as an RFID tag spacer 116.

In an embodiment, the RFID tag spacer 116 has a thickness in a range from about 0.5 µm (micrometers) to about 100 µm. In an embodiment, the RFID tag spacer 116 has a thickness in a range from about 1 µm to about 60 µm. In an embodiment, the RFID tag spacer 116 has a thickness in a range from about 2 µm to about 20 µm.

Referring again to FIG. 1, the RFID tag spacer 116 is not electrically coupled to either of the first die 110 or the second die 124. Accordingly, the RFID tag spacer 116 is a stand-alone transceiver that is able to use imposed radiant energy to return an identifying signal according to an embodiment.

Figure 3:
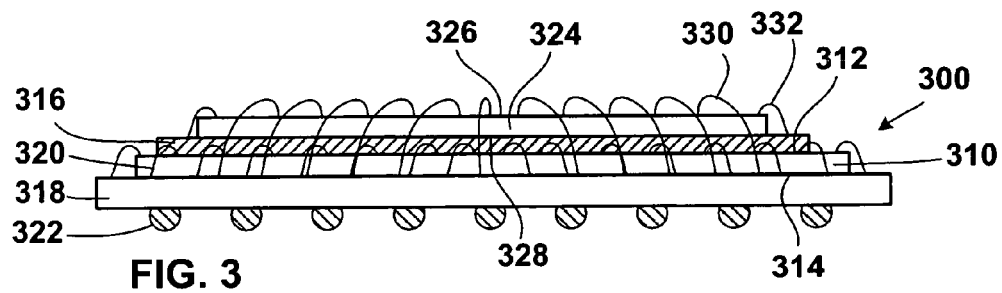
FIG. 3 is a cross-section elevation of an RFID tag spacer between two microelectronic dice according to an embodiment.

FIG. 3 is a cross-section elevation of an RFID tag spacer between two microelectronic dice according to an embodiment. A package 300 includes a first die 310 with an active surface 312 and a backside surface 314. An RFID tag spacer 316 is disposed on the first die 310 active surface 312. In an embodiment, the first die 310 is wire-bonded to a mounting substrate 318. The wire bonding is accomplished with at least one bond wire, one of which is designated with the reference numeral 320. In an embodiment, the mounting substrate 318 communicates electrically to the external world with a plurality of electrical bumps, one of which is designated with the reference numeral 322.

In an embodiment, a second die 324 is disposed on the RFID tag spacer 316. In this embodiment, the second die 324 includes an active surface 326 and a backside surface 328. The RFID tag spacer 316 is disposed on the second die 324 backside surface 328. In an embodiment, the second die 324 is wire-bonded to the mounting substrate 318. The wire bonding is accomplished with at least one bond wire, one of which is designated with the reference numeral 330.

In this embodiment, the RFID tag spacer 316 is electrically coupled to the second die 324 by way of an RFID bond wire 332. Accordingly, the RFID tag spacer 316 can receive either or both of power and signal communication from the second die 324. In an embodiment, the transceiver in the RFID tag spacer 316 is able to use imposed radiant energy to return an identifying signal according to an embodiment.

In an embodiment, the first die 310 is a logic chip such as a processor, and the second die 324 is a memory chip. In an embodiment, the first die 310 is a memory chip, and the second die 324 is a processor. In an embodiment, the first die 310 is logic chip and the second die 324 is a DSP chip. It now becomes apparent that the first die 310 and the second die 324 can be any combination of processor, memory, and DSP chips. One of these combinations includes two processors. One of these combinations includes a processor and a memory chip. One of these combinations includes two memory chips. One of these combinations includes a DSP chip in lieu of either of the memory chip or the processor. One of these combinations includes an embedded DSP chip in either a processor or a memory chip.

Figure 4:
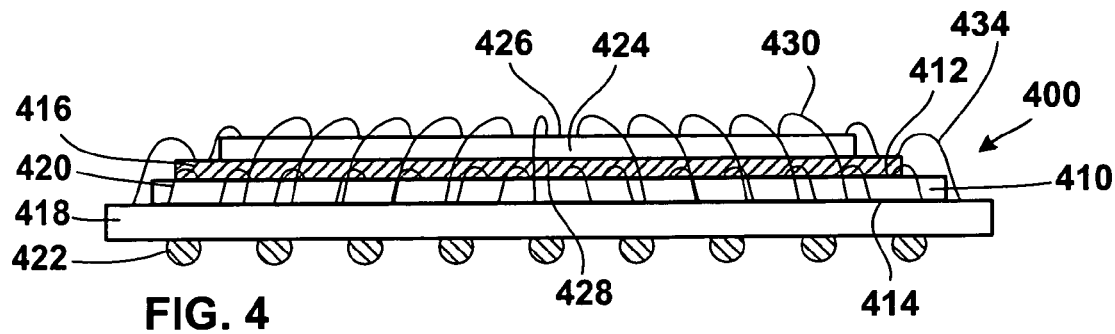
FIG. 4 is a cross-section elevation of an RFID tag spacer between two microelectronic dice according to an embodiment.

FIG. 4 is a cross-section elevation of an RFID tag spacer between two microelectronic dice according to an embodiment. A package 400 includes a first die 410 with an active surface 412 and a backside surface 414. An RFID tag spacer 416 is disposed on the first die 410 active surface 412. In an embodiment, the first die 410 is wire-bonded to a mounting substrate 418. The wire bonding is accomplished with at least one bond wire, one of which is designated with the reference numeral 420. In an embodiment, the mounting substrate 418 communicates electrically to the external world with a plurality of electrical bumps, one of which is designated with the reference numeral 422.

In an embodiment, a second die 424 is disposed on the RFID tag spacer 416. In this embodiment, the second die 424 includes an active surface 426 and a backside surface 428. The RFID tag spacer 416 is disposed on the second die 424 backside surface 428. In an embodiment, the second die 424 is wire-bonded to the mounting substrate 418. The wire bonding is accomplished with at least one bond wire, one of which is designated with the reference numeral 430.

In this embodiment, the RFID tag spacer 416 is electrically coupled to the mounting substrate 418 by way of an RFID bond wire 434. Accordingly, the RFID tag spacer 416 can receive either or both of power and signal communication from the mounting substrate 418. In an embodiment, the transceiver in the RFID tag spacer 416 is able to use imposed radiant energy to return an identifying signal according to an embodiment.

In an embodiment, the first die 410 is a logic chip such as a processor, and the second die 424 is a memory chip. In an embodiment, the first die 410 is a memory chip, and the second die 424 is a processor. In an embodiment, the first die 410 is logic chip and the second die 424 is a DSP chip. It now becomes apparent that the first die 410 and the second die 424 can be any combination of processor, memory, and DSP chips. One of these combinations includes two processors. One of these combinations includes a processor and a memory chip. One of these combinations includes two memory chips. One of these combinations includes a DSP chip in lieu of either of the memory chip or the processor. One of these combinations includes an embedded DSP chip in either a processor or a memory chip.

Figure 5:
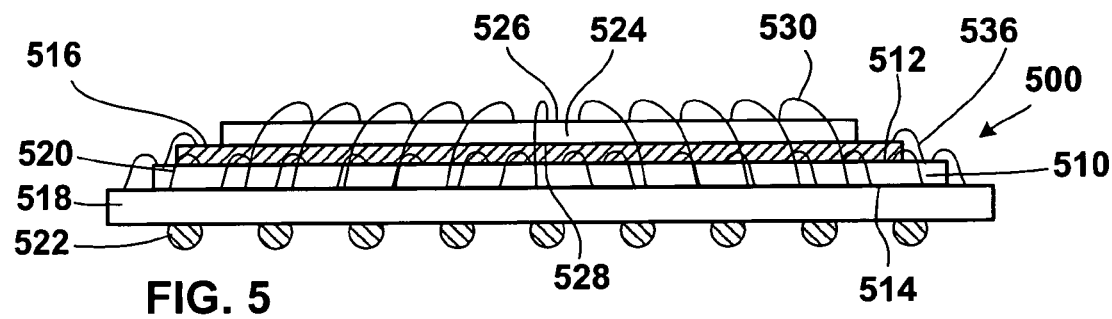
FIG. 5 is a cross-section elevation of an RFID tag spacer between two microelectronic dice according to an embodiment.

FIG. 5 is a cross-section elevation of an RFID tag spacer between two microelectronic dice according to an embodiment. A package 500 includes a first die 510 with an active surface 512 and a backside surface 514. An RFID tag spacer 516 is disposed on the first die 510 active surface 512. In an embodiment, the first die 510 is wire-bonded to a mounting substrate 518. The wire bonding is accomplished with at least one bond wire, one of which is designated with the reference numeral 520. In an embodiment, the mounting substrate 518 communicates electrically to the external world with a plurality of electrical bumps, one of which is designated with the reference numeral 522.

In an embodiment, a second die 524 is disposed on the RFID tag spacer 516. In this embodiment, the second die 524 includes an active surface 526 and a backside surface 528. The RFID tag spacer 516 is disposed on the second die 524 backside surface 528. In an embodiment, the second die 524 is wire-bonded to the mounting substrate 518. The wire bonding is accomplished with at least one bond wire, one of which is designated with the reference numeral 530.

In this embodiment, the RFID tag spacer 516 is electrically coupled to the first die 510 at the active surface 512 by way of an RFID bond wire 536. Accordingly, the RFID tag spacer 516 can receive either or both of power and signal communication from the first die 510. In an embodiment, the transceiver in the RFID tag spacer 516 is able to use imposed radiant energy to return an identifying signal according to an embodiment.

In an embodiment, the first die 510 is a logic chip such as a processor, and the second die 524 is a memory chip. In an embodiment, the first die 510 is a memory chip, and the second die 524 is a processor. In an embodiment, the first die 510 is logic chip and the second die 524 is a DSP chip. It now becomes apparent that the first die 510 and the second die 524 can be any combination of processor, memory, and DSP chips. One of these combinations includes two processors. One of these combinations includes a processor and a memory chip. One of these combinations includes two memory chips. One of these combinations includes a DSP chip in lieu of either of the memory chip or the processor. One of these combinations includes an embedded DSP chip in either a processor or a memory chip.

Figure 6:
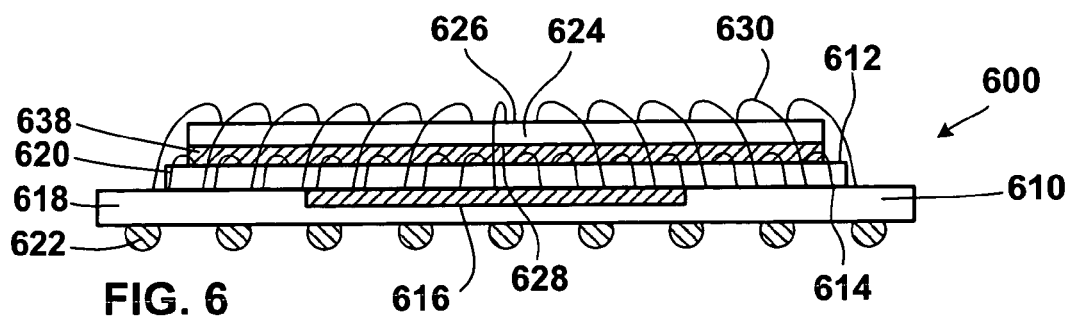
FIG. 6 is a cross-section elevation of an RFID tag spacer that is integral with a mounting substrate according to an embodiment.

FIG. 6 is a cross-section elevation of an RFID tag in a spacer structure that is integral with a mounting substrate according to an embodiment. A package 600 includes a first die 610 with an active surface 612 and a backside surface 614. An RFID tag spacer 616 is disposed integral to a mounting substrate 618. Accordingly, the RFID tag spacer 616 is disposed on the first die 610 backside surface 614. In an embodiment, the first die 610 is wire-bonded to the mounting substrate 618. The wire bonding is accomplished with at least one bond wire, one of which is designated with the reference numeral 620. In an embodiment, the mounting substrate 618 communicates electrically to the external world with a plurality of electrical bumps, one of which is designated with the reference numeral 622.

In an embodiment, a second die 624 is disposed above the first die 610 by use of an adhesive 638. In this embodiment, the second die 624 includes an active surface 626 and a backside surface 628. In an embodiment, the second die 624 is wire-bonded to the mounting substrate 618. The wire bonding is accomplished with at least one bond wire, one of which is designated with the reference numeral 630.

In this embodiment, the RFID tag spacer 616 is not electrically coupled to either of the first die 610 or the second die 624. Accordingly, the RFID tag spacer 616 is a stand-alone transceiver that is able to use imposed radiant energy to return an identifying signal according to an embodiment.

In an embodiment, the first die 610 is a logic chip such as a processor, and the second die 624 is a memory chip. In an embodiment, the first die 610 is a memory chip, and the second die 624 is a processor. In an embodiment, the first die 610 is logic chip and the second die 624 is a DSP chip. It now becomes apparent that the first die 610 and the second die 624 can be any combination of processor, memory, and DSP chips. One of these combinations includes two processors. One of these combinations includes a processor and a memory chip. One of these combinations includes two memory chips. One of these combinations includes a DSP chip in lieu of either of the memory chip or the processor. One of these combinations includes an embedded DSP chip in either a processor or a memory chip.

Figure 7:
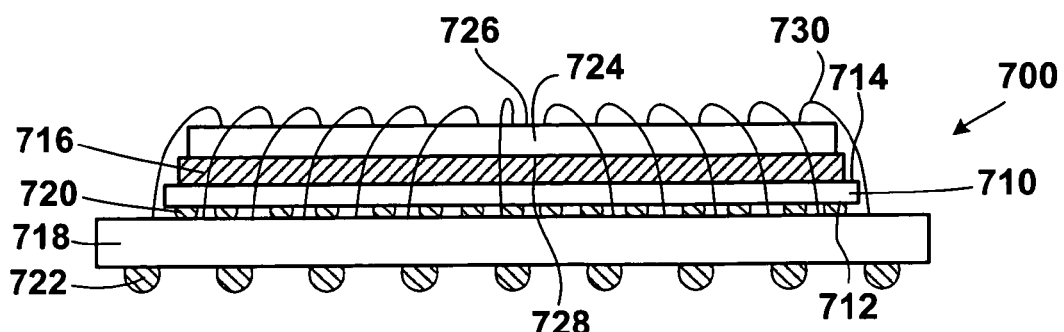
FIG. 7 is a cross-section elevation of an RFID tag spacer between a flip-chip and a wire-bond chip according to an embodiment.

FIG. 7 is a cross-section elevation of an RFID tag spacer between a flip-chip and a wire-bond chip according to an embodiment. A package 700 includes a first die 710 with an active surface 712 and a backside surface 714. An RFID tag spacer 716 is disposed on the first die 710 backside surface 714. In an embodiment, the first die 710 is flip-chip bonded to a mounting substrate 718. The flip-chip bonding is accomplished with at least one electrical bump, one of which is designated with the reference numeral 720. In an embodiment, the mounting substrate 718 communicates electrically to the external world with a plurality of electrical bumps, one of which is designated with the reference numeral 722. In an embodiment, the first die 710 is a logic chip. In an embodiment, the first die 710 is a memory chip. In an embodiment, the first die 710 is a DSP chip.

In an embodiment, a second die 724 is disposed on the RFID tag spacer 716. In this embodiment, the second die 724 includes an active surface 726 and a backside surface 728. The RFID tag spacer 716 is disposed on the second die 724 backside surface 728. In an embodiment, the second die 724 is wire-bonded to the mounting substrate 718. The wire bonding is accomplished with at least one bond wire, one of which is designated with the reference numeral 730.

In an embodiment, the first die 710 is a logic chip such as a processor, and the second die 724 is a memory chip. In an embodiment, the first die 710 is a memory chip, and the second die 724 is a processor. In an embodiment, the first die 710 is logic chip and the second die 724 is a DSP chip. It now becomes apparent that the first die 710 and the second die 724 can be any combination of processor, memory, and DSP chips. One of these combinations includes two processors. One of these combinations includes a processor and a memory chip. One of these combinations includes two memory chips. One of these combinations includes a DSP chip in lieu of either of the memory chip or the processor. One of these combinations includes an embedded DSP chip in either a processor or a memory chip.

As depicted, the RFID tag spacer 716 is not electrically coupled to any of the first die 710, the second die 724, and the mounting substrate 718. In an embodiment, the flip-chip 710 and RFID tag spacer 716 are electrically coupled such as is depicted in FIG. 4, where electrical coupling is through the bond wire 730 and the electrical bump 720. Other electrical coupling embodiments such as the RFID tag spacer 716 to the first die 710 and to the second die 724 can be accomplished as depicted in various embodiments set forth in this disclosure.

Figure 8:
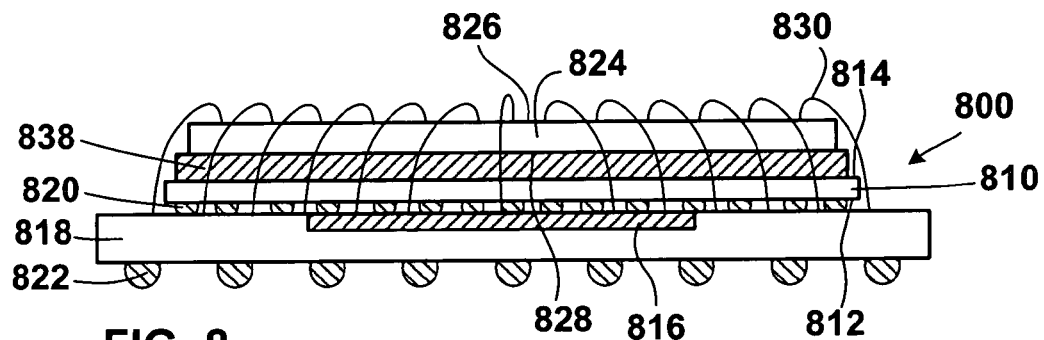
FIG. 8 is a cross-section elevation of an RFID tag spacer that is integral with a mounting substrate according to an embodiment.

FIG. 8 is a cross-section elevation of an RFID tag in a spacer structure that is integral with a mounting substrate according to an embodiment. A package 800 includes a first die 810 with an active surface 812 and a backside surface 814. An RFID tag spacer 816 is disposed integral to a mounting substrate 818. The first die 810 is flip-chip disposed on the mounting substrate 818. The flip-chip bonding is accomplished with at least one electrical bump, one of which is designated with the reference numeral 820. Accordingly, the RFID tag spacer 816 is disposed substantially on the first die 810 active surface 812. In an embodiment, the mounting substrate 818 communicates electrically to the external world with a plurality of electrical bumps, one of which is designated with the reference numeral 822.

In an embodiment, a second die 824 is disposed above the first die 810 by use of an adhesive 838. In this embodiment, the second die 824 includes an active surface 826 and a backside surface 828. In an embodiment, the second die 824 is wire-bonded to the mounting substrate 818. The wire bonding is accomplished with at least one bond wire, one of which is designated with the reference numeral 830.

In an embodiment, the RFID tag spacer 816 is not electrically coupled to either of the first die 810 or the second die 824. Accordingly, the RFID tag spacer 816 is a stand-alone transceiver that is able to use imposed radiant energy to return an identifying signal according to an embodiment.

In an embodiment, the first die 810 is a logic chip such as a processor, and the second die 824 is a memory chip. In an embodiment, the first die 810 is a memory chip, and the second die 824 is a processor. In an embodiment, the first die 810 is logic chip and the second die 824 is a DSP chip. It now becomes apparent that the first die 810 and the second die 824 can be any combination of processor, memory, and DSP chips. One of these combinations includes two processors. One of these combinations includes a processor and a memory chip. One of these combinations includes two memory chips. One of these combinations includes a DSP chip in lieu of either of the memory chip or the processor. One of these combinations includes an embedded DSP chip in either a processor or a memory chip.

In an embodiment, the flip-chip 810 and RFID tag spacer 816 are electrically through the electrical bumps 820. Other electrical coupling embodiments such as the RFID tag spacer 816 to the first die 810 and to the second die 824 can be accomplished as depicted in various embodiments set forth in this disclosure.

Figure 9:
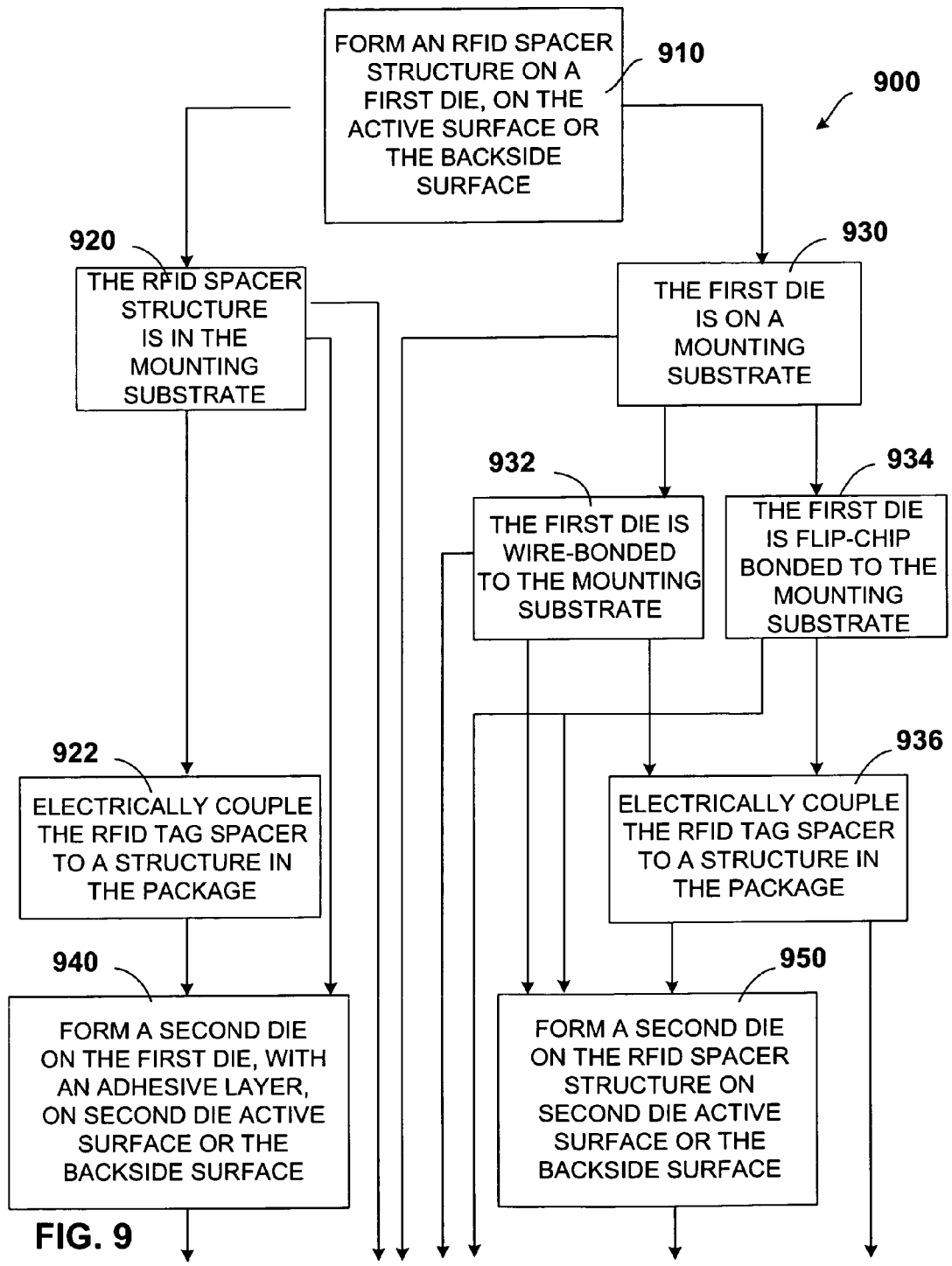
FIG. 9 is a flow chart that describes method flow embodiments.

FIG. 9 is a flow chart 900 that describes method flow embodiments.

At 910, the method includes forming an RFID tag spacer on a first die, on one of the first die active surface and the backside surface. In a non-limiting example, the RFID tag spacer 116 is formed on the first die 110 active surface 112. In a non-limiting example, the RFID tag spacer 716 is formed on the first die 710 backside surface 714. In an embodiment, the method commences at 910 and terminates at 910.

At 920, the method includes the RFID tag spacer that is integral to the mounting substrate. In a non-limiting example, the RFID tag spacer 616 is formed on the backside surface 614 of the first die 610 by coupling the first die 610 to the RFID tag spacer 616 by a laminating process such as oxide-oxide bonding between the respective active surface 612 (that is an oxide dielectric for metallization, for example) and the oxide material of the RFID spacer structure 616.

At 922, the method includes electrically coupling the RFID tag spacer to a structure in the package. In a non-limiting example, the RFID tag spacer 816 is coupled to the first die 810 through the mounting substrate 818 by an electrical bump 820 that is disposed therebetween.

At 940, the method includes forming a second die on the first die, with an adhesive layer and on the first die active surface or backside surface. In a non-limiting example, the second die 624 is formed above the first die 610 with an adhesive 638, and the contact there between is at the first die 610 active surface 612. In a non-limiting example, the second die 824 is formed above the first die 810 with an adhesive 838, and the contact there between is at the first die 810 backside surface 814. In an embodiment, the method commences at 910 and terminates at 940.

At 930, the method includes the first die that is on a mounting substrate. In a non-limiting example, the first die 110 is first laminated with the RFID tag spacer 116 and then disposed on the mounting substrate 118. In a non-limiting example, the first die 110 is disposed on the mounting substrate 118 and subsequently, the RFID tag spacer 116 is bonded to the first die 110 active surface 112.

At 932, the method includes the first die being a wire-bond die. In a non-limiting example, the first die 110 is disposed on the mounting substrate 118 and wire bonded. The assembly of the RFID tag spacer 116 to the first die 110 can precede or follow the wire bonding of the first die 110 to the mounting substrate 118.

At 934, the method includes the first die being a flip-chip die. In a non-limiting example, the first die 710 is controlled-collapse disposed on the mounting substrate 718 and the electrical bumps 720 form a bond to the mounting substrate 718. The assembly of the RFID tag spacer 716 to the first die 710 can precede or follow the controlled-collapse bonding of the first die 710 to the mounting substrate 718.

At 936, the method includes electrically coupling the RFID tag spacer to a structure in the package. In a non-limiting example, the RFID tag spacer 316 is coupled to the second die 310 through the bond wire 332.

At 950, the method includes forming a second die on the RFID tag spacer and on the second die active backside surface. In a non-limiting example, the second die 724 is formed on the RFID tag spacer 716. In an embodiment, the method commences at 910 and terminates at 950.

Figure 10:
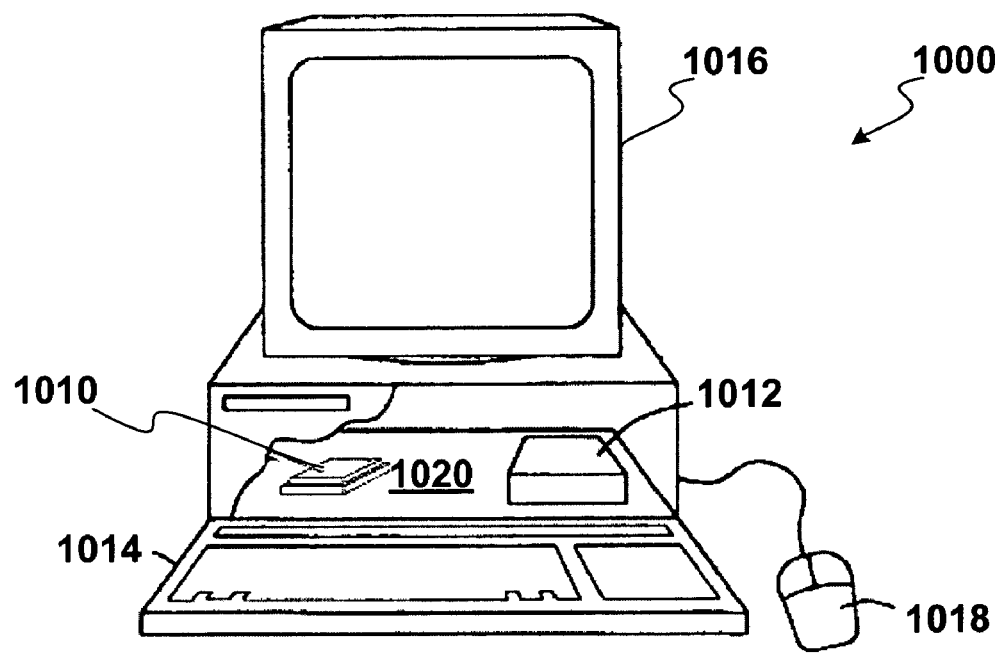
FIG. 10 is a cut-away elevation that depicts a computing system according to an embodiment.

FIG. 10 is a cut-away elevation that depicts a computing system 1000 according to an embodiment. One or more of the foregoing embodiments of the RFID tag spacers may be utilized in a computing system, such as a computing system 1000 of FIG. 10. Hereinafter any RFID tag spacer embodiment alone or in combination with any other embodiment is referred to as an embodiment(s) configuration.

The computing system 1000 includes at least one processor, which is enclosed in an IC chip package 1010, a data storage system 1012, at least one input device such as a keyboard 1014, and at least one output device such as a monitor 1016, for example. The computing system 1000 includes a processor that processes data signals, and may include, for example, a microprocessor, available from Intel Corporation. In addition to the keyboard 1014, the computing system 1000 can include another user input device such as a mouse 1018, for example. The computing system 1000 can include a structure such as depicted in FIGS. 1-8 with a given RFID tag spacer embodiment.

For purposes of this disclosure, a computing system 1000 embodying components in accordance with the claimed subject matter may include any system that utilizes a microelectronic device system, which may include, for example, at least one of the RFID tag spacer embodiments that is coupled to external data storage 1012 such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 1012.

In an embodiment, the computing system 1000 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on the board 1020. In this embodiment, an embodiment(s) configuration is coupled to the DSP, and a separate embodiment(s) configuration may be present that is coupled to the processor in the IC chip package 1010. Additionally in an embodiment, an embodiment(s) configuration is coupled to a DSP that is mounted on the same board 1020 as the IC chip package 1010. It can now be appreciated that the embodiment(s) configuration can be combined as set forth with respect to the computing system 1000, in combination with an embodiment(s) configuration as set forth by the various embodiments of the RFID tag spacers within this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a handheld device such as a personal data assistant and the like. Another example is a die that can be packaged with an embodiment(s) configuration and placed in a vehicle such as an automobile, a locomotive, a watercraft, an aircraft, or a spacecraft.

Figure 11:
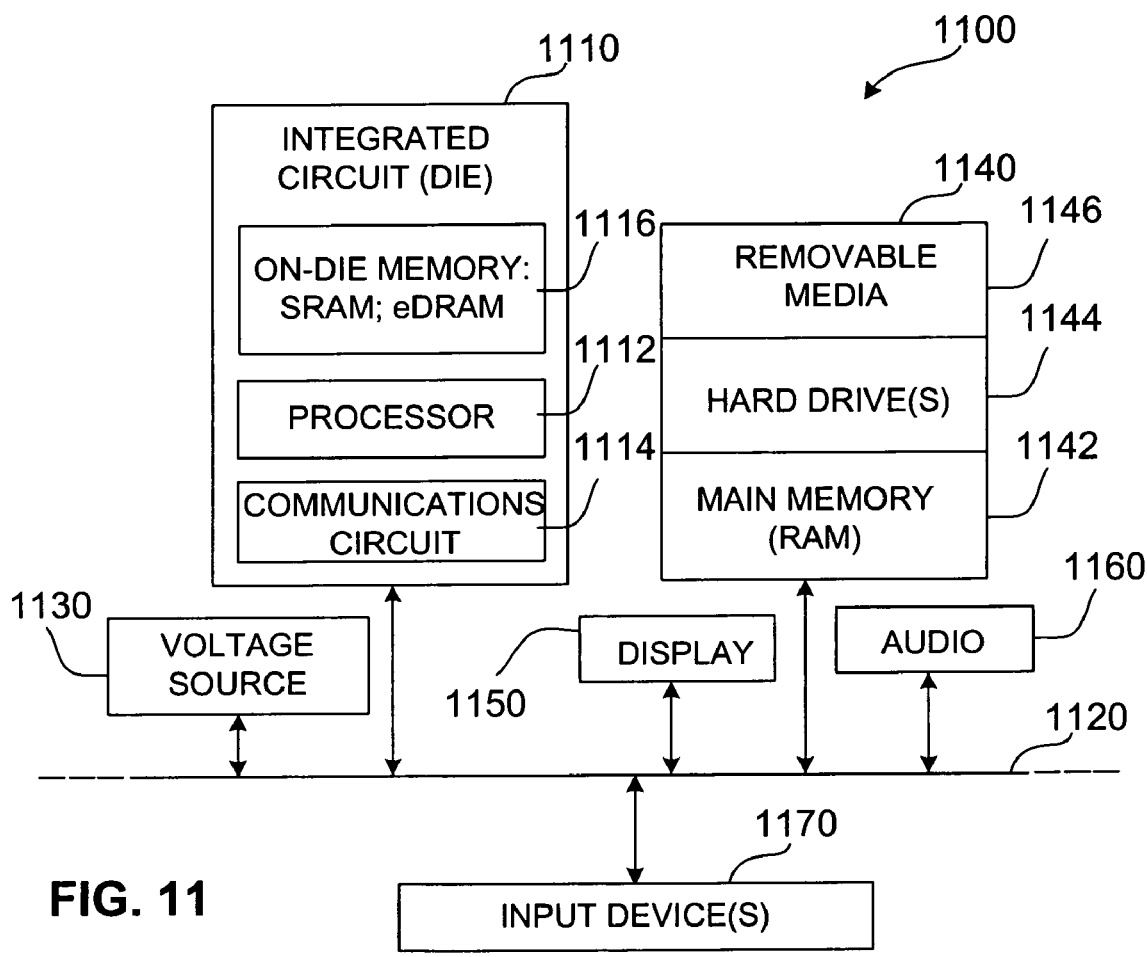
FIG. 11 is a schematic of a computing system according to an embodiment.

FIG. 11 is a schematic of an electronic system 1100 according to an embodiment. The electronic system 1100 as depicted can embody the computing system 1000 depicted in FIG. 10, but the electronic system is depicted more generically. The electronic system 1100 incorporates at least one electronic assembly 1110, such as an IC die illustrated in FIGS. 1-8. In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 means any type of circuit such as, but not limited to, a microprocessor, a microcontroller, a graphics processor, a digital signal processor, or another processor. Other types of circuits that can be included in the integrated circuit 1110 are a custom circuit or an ASIC, such as a communications circuit 1114 for use in wireless devices such as cellular telephones, pagers, portable computers, two-way radios, and similar electronic systems. In an embodiment, the processor 1110 includes on-die memory 1116 such as SRAM. In an embodiment, the processor 1110 includes on-die memory 1116 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital video disks (DVDs), flash memory keys, and other removable media known in the art.

In an embodiment, the electronic system 1100 also includes a display device 1150, an audio output 1160. In an embodiment, the electronic system 1100 includes a controller 1170, such as a keyboard, mouse, trackball, game controller, microphone, voice-recognition device, or any other device that inputs information into the electronic system 1100.

As shown herein, integrated circuit 1110 can be implemented in a number of different embodiments, including an electronic package, an electronic system, a computer system, one or more methods of fabricating an integrated circuit, and one or more methods of fabricating an electronic assembly that includes the integrated circuit and one of the RFID tag spacers as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus comprising:
    a first die including a first die active surface and a first die backside surface;
    a spacer structure disposed upon one of the first die active surface and the first die backside surface, and wherein the spacer structure includes a radio-frequency identification (RFID) tag and an antenna disposed within the spacer structure; wherein the RFID tag and the antenna are not electrically coupled to any component external to the spacer structure.

2. The apparatus of claim 1, wherein the spacer structure is disposed against the first die backside surface.

3. The apparatus of claim 1, wherein the first die is disposed upon a mounting substrate, and wherein the spacer structure is integral to the mounting substrate.

4. The apparatus of claim 1, wherein the first die is disposed upon a mounting substrate, and wherein the spacer structure is integral to the mounting substrate, the apparatus further including:
    a second die including a second die active surface and a second die backside surface, wherein the second die is disposed above the first die, and wherein one of the first die and the second die include first die principally includes dynamic random-access memory, and wherein the other of the first die and the second die principally includes logic circuitry.

5. The apparatus of claim 1, wherein the spacer structure is disposed against the first die backside surface, wherein the first die principally includes one of logic circuitry or of dynamic random-access memory, the apparatus further including:
   a second die including a second die active surface and a second die backside surface, wherein the spacer structure is disposed upon the second die active surface, and wherein the second die principally includes the other of the logic circuitry and of the dynamic random-access memory.

6. The apparatus of claim 1, further including a mounting substrate disposed below the first die, and wherein the RFID spacer structure is disposed between the first die and a second die and the backside surface thereof.

7. The apparatus of claim 1, further including a mounting substrate and wherein the first die is disposed on the mounting substrate by a configuration selected from wire-bond and flip-chip.

8. A method comprising:
   forming an RFID spacer structure on a first die, wherein the first die includes a first die active surface and a first die backside surface, and wherein forming includes forming the RFID spacer structure on one of the first die active surface and a first die backside surface, and wherein forming the RFID spacer structure includes forming a radio-frequency identification (RFID) tag and an antenna disposed within the RFID spacer; wherein the RFID tag and antenna are not electrically coupled to any component external to the spacer structure.

9. The method of claim 8, further including:
   forming a second die on the RFID spacer structure, the second die including a second die active surface and a second die backside surface.

10. The method of claim 8, further including:
    disposing the first die on a mounting substrate.

11. The method of claim 8, further including:
    disposing the first die on a mounting substrate; and
    forming a second die on the RFID tag layer, the second die including a second die active surface and a second die backside surface.

12. A system comprising:
    a first die including an active surface and a backside surface;
    an RFID spacer structure disposed on one of the first die active surface and the first die backside surface tag; wherein the RFID spacer structure includes an RFID tag and an antenna disposed therein; wherein the RFID tag and the antenna are not electrically coupled to any component external to the spacer structure; and
    dynamic random-access memory coupled to the first die.

13. The system of claim 12, wherein the first die is dispose upon a mounting substrate, and wherein the RFID spacer structure is disposed integral to the mounting substrate.

14. The system of claim 12, wherein the system is disposed in one of a computer, a wireless communicator, a hand-held device, an automobile, a locomotive, an aircraft, a watercraft, and a spacecraft.

15. The system of claim 12, wherein the die is selected from a data storage device, a digital signal processor, a micro controller, an application specific integrated circuit, and a microprocessor.

* * * * *

UNITED STATES PATENT AND TRADEMARK OFFICE
CERTIFICATE OF CORRECTION

| | | |
|---|---|---|
| PATENT NO. | : 8,317,107 B2 | |
| APPLICATION NO. | : 11/323903 | |
| DATED | : November 27, 2012 | |
| INVENTOR(S) | : Joan Rey V. Buot et al. | |

It is certified that error appears in the above-identified patent and that said Letters Patent is hereby corrected as shown below:

In column 11, line 1, in claim 4, after "second die" delete "include first die".

In column 12, line 22, in claim 13, delete "dispose" and insert -- disposed --, therefor.

Signed and Sealed this
Fifth Day of March, 2013

Teresa Stanek Rea
*Acting Director of the United States Patent and Trademark Office*